(12) United States Patent
Wert

(10) Patent No.: US 7,276,938 B1
(45) Date of Patent: Oct. 2, 2007

(54) TRANSFER GATE HAVING OVERVOLTAGE PROTECTION AND METHOD

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/280,103

(22) Filed: Nov. 16, 2005

(51) Int. Cl.
*H03K 19/20* (2006.01)
(52) U.S. Cl. .................. 326/81; 326/113; 361/91.1
(58) Field of Classification Search .............. 326/81, 326/113, 120–122; 327/404, 407, 408; 361/56, 361/90, 91.1, 91.5
See application file for complete search history.

(56) References Cited

U.S. PATENT DOCUMENTS 6,384,631 B1 * 5/2002 Wert et al. .................. 326/68
6,501,318 B1 * 12/2002 Randazzo et al. .......... 327/309
6,700,407 B1 * 3/2004 Wert ........................... 326/81

* cited by examiner

*Primary Examiner*—Minh-Loan Tran

(57) ABSTRACT

A circuit includes a first native or depletion n-channel Metal Oxide Semiconductor (MOS) transistor and a second native or depletion n-channel MOS transistor. The first and second native or depletion n-channel MOS transistors are capable of receiving an input signal. The circuit also includes a standard p-channel MOS transistor and a standard n-channel MOS transistor. The standard MOS transistors are coupled to the native or depletion n-channel MOS transistors and are capable of providing an output signal. The output signal is based on the input signal. Gates of the native or depletion n-channel MOS transistors may be thicker than gates of the standard MOS transistors. The native or depletion n-channel MOS transistors may be capable of blocking excessive voltage from the standard MOS transistors. The standard MOS transistors may be capable of selectively blocking the input signal from the output signal.

20 Claims, 3 Drawing Sheets

US 7,276,938 B1

TRANSFER GATE HAVING OVERVOLTAGE PROTECTION AND METHOD

TECHNICAL FIELD

This disclosure is generally directed to transistor devices and more specifically to a transfer gate having overvoltage protection and method.

BACKGROUND

Different types of Metal Oxide Semiconductor (MOS) transistors can be fabricated and used in electronic circuits. For example, thick-gate and thin-gate transistors could be used in electronic circuits, where the thick-gate and thin-gate transistors have gate oxide layers of different thicknesses. As another example, standard, native, and depletion n-channel MOS (NMOS) transistors could be used in electronic circuits. A standard NMOS transistor is typically formed within a p-well, a native NMOS transistor is typically formed directly on a semiconductor substrate, and a depletion NMOS transistor is typically formed within a p-well that has a special depletion implant in the gate region of the transistor.

The different types of transistors typically have different operating characteristics. For example, a gate-to-source voltage ($V_{GS}$) at or near zero volts may be needed to turn off a thick-gate standard NMOS transistor, a gate-to-source voltage of −300 millivolts may be needed to turn off a thick-gate native NMOS transistor, and a gate-to-source voltage of −500 to −600 millivolts may be needed to turn off a thick-gate depletion NMOS transistor. In certain circuits, this means that native and depletion NMOS transistors cannot be turned completely off, such as when a source voltage rail ($V_{DD}$) is 1.8 volts and a ground voltage rail ($V_{SS}$) is zero volts. The inability to completely turn off native and depletion NMOS transistors often prevents the native and depletion NMOS transistors from being used in standard logic gates and other circuits.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
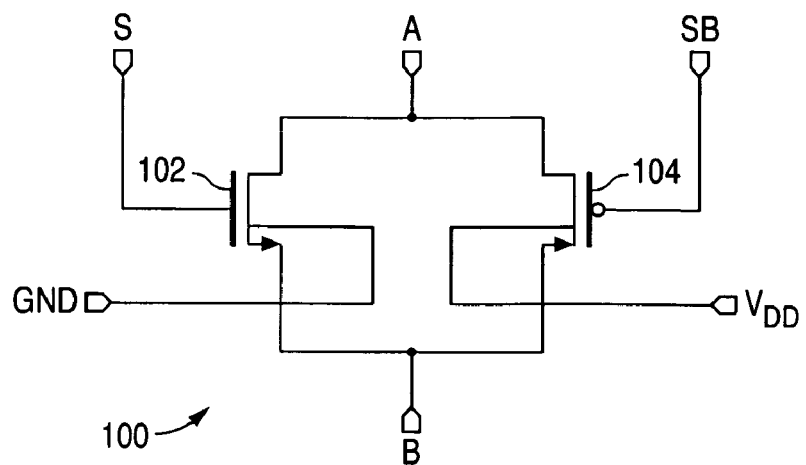
FIG. 1 illustrates a standard transfer gate formed from standard MOS transistors.

FIG. 1 illustrates a standard transfer gate 100 formed from standard MOS transistors 102-104. In this example, the transistor 102 represents a standard n-channel MOS (NMOS) transistor, and the transistor 104 represents a standard p-channel MOS (PMOS) transistor. Drains of the transistors 102-104 are coupled to an input signal A, and sources of the transistors 102-104 are coupled to an output signal B. A gate of the transistor 102 receives a signal S, and a gate of the transistor 104 receives a signal SB. A bulk of the transistor 102 is coupled to a ground voltage rail (GND), and a bulk of the transistor 104 is coupled to a source voltage rail ($V_{DD}$).

In general, a transfer gate receives an input signal and provides an output signal that matches or approximates the input signal. In this example, the transfer gate 100 receives the input signal A and provides the output signal B, which approximates the input signal A. When the signal S is high and the signal SB is low, the transfer gate 100 typically passes both high and low values efficiently. In digital circuits, the input signal A typically contains logic high ("1") and logic low ("0") values. In analog circuits, the input signal A may typically contain any value between the ground voltage rail and the source voltage rail.

The transfer gate 100 shown in FIG. 1 may perform well when used in digital circuits. However, the transfer gate 100 may also be used in low voltage analog applications, such as applications where $V_{DD}$ has a maximum value of approximately 1.8 volts. In order for the transfer gate 100 to work well in these applications, the transistors 102-104 are typically thin-gate transistors, which may have a maximum allowable gate-to-source voltage ($V_{GS}$) or gate-to-drain voltage ($V_{GD}$) of approximately 2.6 volts. This means that the transfer gate 100 often cannot be used in applications where the input signal A could have a voltage greater than 2.6 volts, such as in noisy environments where the voltage of the input signal A may spike to five volts.

To compensate for this problem, thick-gate standard MOS transistors could be used as the transistors 102-104. Also, a resistor may be placed between the input signal A and the drains of the transistors 102-104. A one kilo-ohm resistor may provide a one volt drop for a one milliamp current, which may help the transfer gate 100 to tolerate a five volt overvoltage condition in the input signal A. However, the output signal B could be provided to a capacitive load, such as a capacitive analog-to-digital converter. In this situation, if the input signal A transitions to a "mid-rail" voltage (a voltage between the GND and $V_{DD}$ voltage rails), it may take an excessive amount of time for the voltage of the output signal B to approximate the input signal A.

Figure 2:
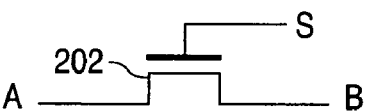
FIG. 2 illustrates a standard transfer gate formed from a native or depletion NMOS transistor.

FIG. 2 illustrates a standard transfer gate 200 formed from a thick-gate native or depletion NMOS transistor 202. In this example, the transistor 202 has a drain coupled to an input signal A and a source coupled to an output signal B. The transistor 202 also has a gate coupled to a control signal S, which controls whether the transistor 202 is conductive.

In some embodiments, the transistor 202 is used in circuits having a ground voltage rail of zero voltages. In these embodiments, the native or depletion NMOS transistor 202 typically cannot be turned off completely by placing a zero volt control signal S on the gate of the transistor 202. Because of this, the transistor 202 may constantly allow leakage between the input signal A and the output signal B.

Figure 3:
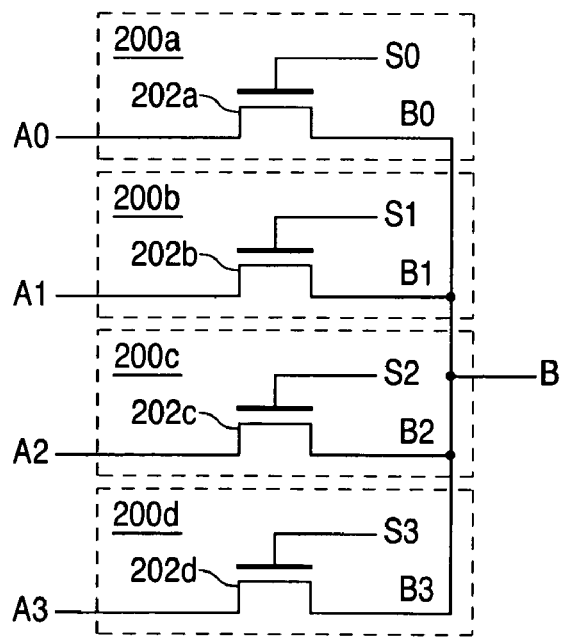
FIG. 3 illustrates a standard multiplexor formed from native or depletion NMOS transistors.

FIG. 3 illustrates a standard multiplexor 300 formed from native or depletion NMOS transistors. In this example, the multiplexor 300 includes four transfer gates 200a-200d, which represent multiple instances of the standard transfer gate 200 shown in FIG. 2. The transfer gates 200a-200d include native or depletion NMOS transistors 202a-202d, respectively. As shown in FIG. 3, the transistors 202a-202d have drains coupled to input signals A0-A3, respectively, and sources coupled to output signals B0-B3, respectively. The transistors 202a-202d also have gates coupled to control signals S0-S3, respectively. An overall output signal B represents a combination of the output signals B0-B3, which ideally represents a selected one of the input signals A0-A3.

As noted above, the transistors 202a-202d in the transfer gates 200a-200d may be used in circuits having a ground voltage rail of zero voltages. In these embodiments, the native or depletion NMOS transistors 202a-202d typically cannot be turned off completely by placing control signals of zero volts on their gates. As a result, the input signals A0-A3 may not be completely blocked from the output signal B. Also, the input signals A0-A3 may "communicate" with or interfere with each other.

Figure 4:
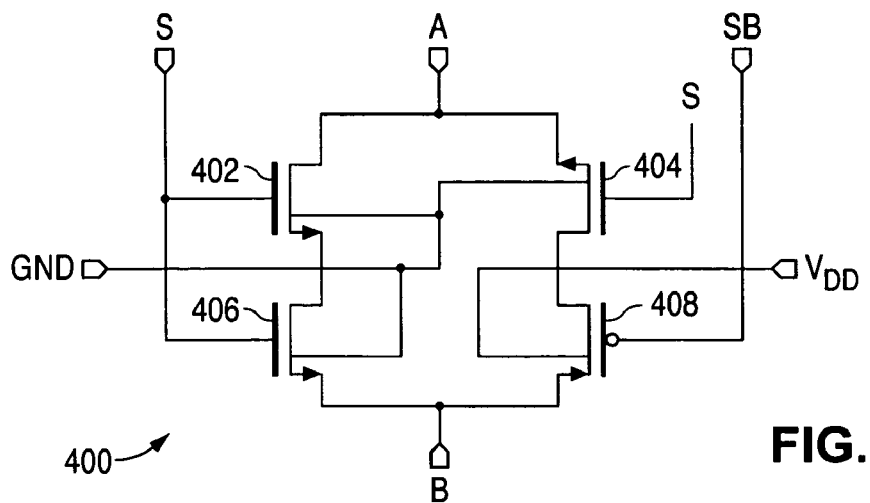
FIG. 4 illustrates an example transfer gate formed from standard MOS transistors and native or depletion NMOS transistors according to one embodiment of this disclosure.

FIG. 4 illustrates an example transfer gate 400 formed from standard MOS transistors and native or depletion NMOS transistors according to one embodiment of this disclosure. Unlike the circuits of the previous figures, the transfer gate 400 of FIG. 4 may be capable of both providing overvoltage protection when excessive input voltages are present and effectively blocking an input signal from an output signal. This may hold true even when the transfer gate 400 is used in low voltage analog applications, such as applications where $V_{DD}$ has a maximum value of approximately 1.8 volts.

As shown in FIG. 4, the transfer gate 400 includes two native or depletion NMOS transistors 402-404, a standard NMOS transistor 406, and a standard PMOS transistor 408. The transistors 402-404 could represent thick-gate native or depletion NMOS transistors, and the transistors 406-408 could represent thin-gate standard MOS transistors.

A drain of the transistor 402 and a source of the transistor 404 are coupled to an input signal A. A source of the transistor 402 is coupled to a drain of the transistor 406, and a drain of the transistor 404 is coupled to a drain of the transistor 408. Sources of the transistors 406-408 are coupled to an output signal B. Gates of the transistors 402-406 are coupled to a control signal S, and a gate of the transistor 408 is coupled to a control signal SB. Bulks of the transistors 402-406 are coupled to a ground voltage rail, and a bulk of the transistor 408 is coupled to a source voltage rail.

In this example, the standard MOS transistors 406-408 implement the transfer function described above with respect to the transfer gate 100 of FIG. 1. This may allow the transfer gate 400 to provide, for example, good analog performance when used in analog circuits. Also, the native or depletion NMOS transistors 402-404 block large voltages from the standard MOS transistors 406-408, whether the native or depletion NMOS transistors 402-404 are turned on or off. This may allow the transfer gate 400 to provide overvoltage protection against overvoltage conditions in the input signal A. In addition, the transfer gate 400 may provide faster operation or better tracking of the input signal A when the transfer gate 400 is connected to a capacitive load.

In some embodiments, the transfer gate 400 includes two native NMOS transistors 402-404. In other embodiments, the transfer gate 400 includes two depletion NMOS transistors 402-404. In yet other embodiments, a combination of native and/or depletion NMOS transistors could be used in the transfer gate 400.

Figure 5:
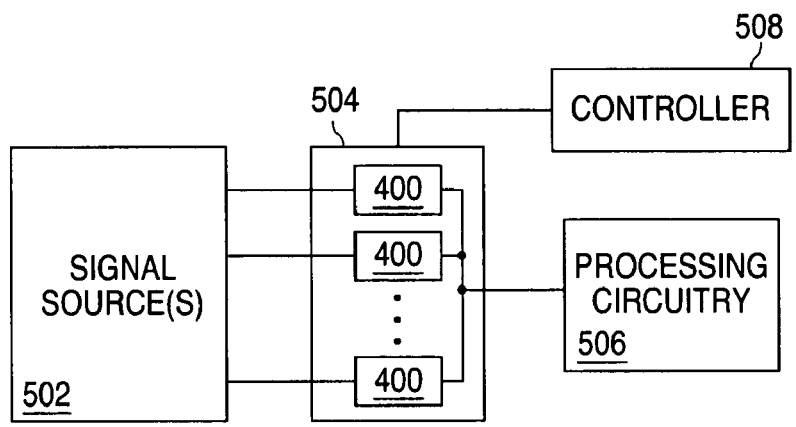
FIG. 5 illustrates an example circuit using the transfer gate of FIG. 4 according to one embodiment of this disclosure.

FIG. 5 illustrates an example circuit 500 using the transfer gate 400 of FIG. 4 according to one embodiment of this disclosure. In this example, the circuit 500 includes one or more signal sources 502, a multiplexor 504, processing circuitry 506, and a controller 508. The one or more signal sources 502 represent any suitable source(s) of digital or analog signals. For example, the one or more signal sources 502 could represent analog or digital circuitry capable of generating analog or digital signals that are provided to the multiplexor 504. The one or more signal sources 502 could also represent circuitry capable of receiving analog or digital signals from external source(s) and providing the signals to the multiplexor 504. The one or more signal sources 502 include any suitable structure or structures capable of providing multiple digital or analog signals.

The multiplexor 504 is coupled to the one or more signal sources 502. The multiplexor 504 receives multiple analog or digital signals from the one or more signal sources 502 and outputs a selected one of the signals. In this example, the multiplexor 504 is formed from multiple transfer gates 400, each of which is capable of receiving one input signal and selectively blocking or outputting the input signal. As noted above, the transfer gates 400 may more effectively block the input signals from the signal output by the multiplexor 504. Each of the transfer gates 400 may receive control signals (signals S and SB) controlling the operation of that transfer gate 400 from any suitable source, such as from the controller 508.

The processing circuitry 506 is coupled to the multiplexor 504. The processing circuitry 506 is capable of receiving the signal output by the multiplexor 504 and processing the signal. For example, the processing circuitry 506 could receive an analog signal output by the multiplexor 504, convert the analog signal into a digital signal, and process the digital signal. The processing circuitry 506 includes any suitable logic capable of processing analog or digital signals, such as an analog-to-digital converter or a capacitive load.

The controller 508 is coupled to the multiplexor 504. The controller 508 could also be coupled to other components in the circuit 500. The controller 508 controls the overall operation of the circuit 500. For example, the controller 508 could generate the control signals needed to control the transfer gates 400 in the multiplexor 504. The controller 508 includes any hardware, software, firmware, or combination thereof for controlling the multiplexor 504.

Figure 6A:
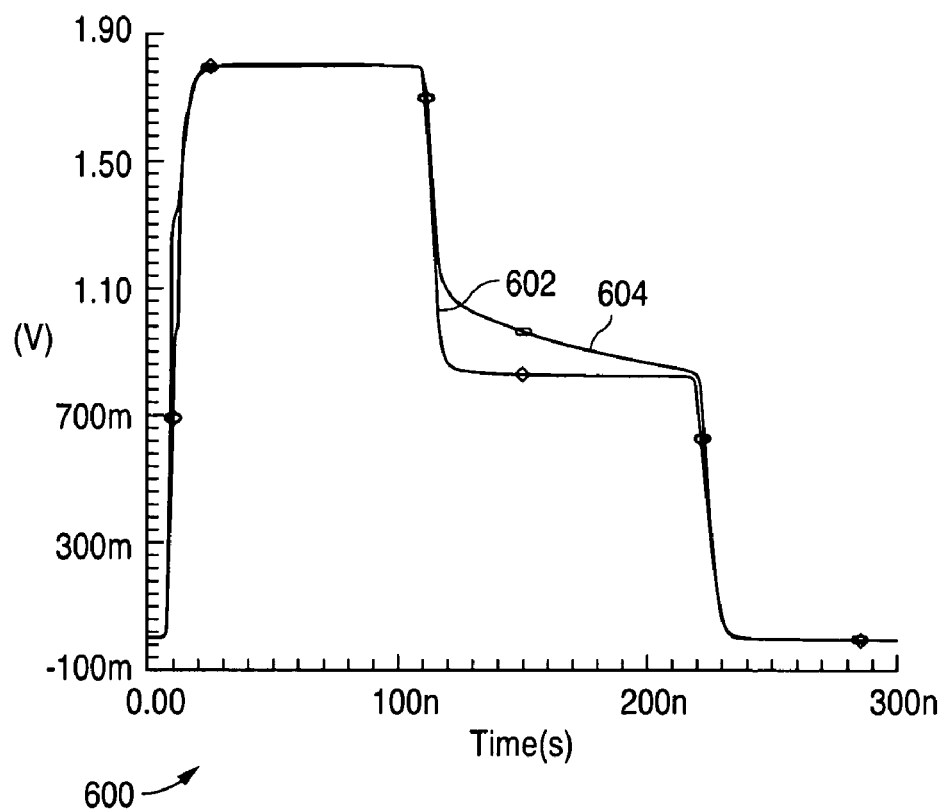
FIGS. 6A and 6B illustrate example operations of different transfer gates according to one embodiment of this disclosure.
Figure 6B:
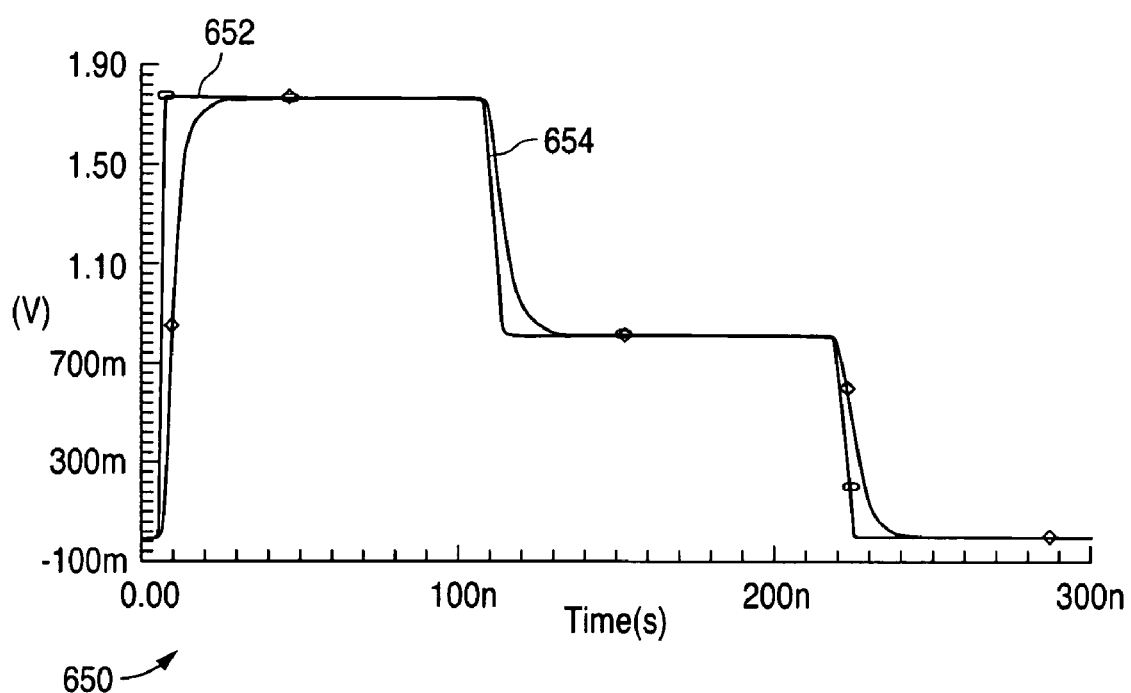

FIGS. 6A and 6B illustrate example operations of transfer gates according to one embodiment of this disclosure. In particular, FIG. 6A illustrates example operation 600 of the transfer gate 100 of FIG. 1 (where the transfer gate 100 has thick-gate transistors 102-104), and FIG. 6B illustrates example operation 650 of the transfer gate 400 of FIG. 4.

In FIG. 6A, a line 602 represents an input signal A provided to the transfer gate 100, and a line 604 represents an output signal B provided by the transfer gate 100. As shown in FIG. 6A, the lines 602-604 diverge greatly during a transition from a high voltage level to a mid-rail voltage level. This indicates that the output signal B fails to accurately track the input signal A during the transition. For example, it may take over 100 nanoseconds for the input signal A and the output signal B to converge during the transition from the high voltage level to the mid-rail voltage level. This could translate into errors if the output signal B is provided to an analog-to-digital converter or other component and further processed.

In FIG. 6B, a line 652 represents an input signal A provided to the transfer gate 400, and a line 654 represents an output signal B provided by the transfer gate 400. As shown in FIG. 6B, the lines 652-654 diverge to a much smaller extent during a transition from a high voltage level to a mid-rail voltage level. For example, it may take approximately 20 nanoseconds for the input signal A and the output signal B to converge during the transition from the high voltage level to the mid-rail voltage level. This indicates that the output signal B may more accurately track the input signal A during the transition when the transfer gate 400 is used.

Figure 7:
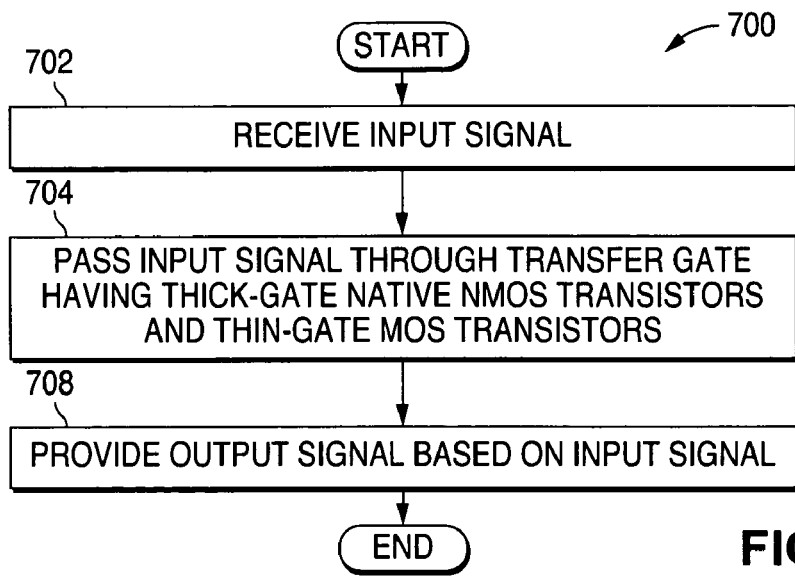
FIG. 7 illustrates an example method for handling a signal using a transfer gate according to one embodiment of this disclosure.

FIG. 7 illustrates an example method 700 for handling a signal using a transfer gate according to one embodiment of this disclosure. For ease of explanation, the method 700 is described with respect to the transfer gate 400 of FIG. 4.

An input signal is received at step 702. This may include, for example, receiving a digital or analog input signal A from any suitable source. The input signal is passed through a transfer gate at step 704. This may include, for example, passing the input signal A through a transfer gate 400 having two thick-gate native or depletion NMOS transistors 402-404 and two thin-gate standard MOS transistors 406-408. The native or depletion NMOS transistors 402-404 protect the standard MOS transistors 406-408 from overvoltage conditions, and the standard MOS transistors 406-408 block signal leakage from the native or depletion NMOS transistors 402-404. An output signal based on the input signal is provided at step 706. This may include, for example, the transfer gate 400 providing an output signal B that approximates the input signal A to an external component, such as the processing circuitry 506 of FIG. 5.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, software, firmware, or combination thereof. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A circuit, comprising:
   a first native or depletion n-channel Metal Oxide Semiconductor (MOS) transistor and a second native or depletion n-channel MOS transistor capable of receiving an input signal; and
   a standard p-channel MOS transistor and a standard n-channel MOS transistor coupled to the native or depletion n-channel MOS transistors and capable of providing an output signal, the output signal based on the input signal.

2. The circuit of claim 1, wherein gates of the native or depletion n-channel MOS transistors are thicker than gates of the standard MOS transistors.

3. The circuit of claim 1, wherein:
   gates of the first native or depletion n-channel MOS transistor, the second native or depletion n-channel MOS transistor, and the standard n-channel MOS transistor are capable of receiving a first control signal; and
   a gate of the standard p-channel MOS transistor is capable of receiving a second control signal.

4. The circuit of claim 1, wherein:
   bulks of the first native or depletion n-channel MOS transistor, the second native or depletion n-channel MOS transistor, and the standard n-channel MOS transistor are coupled to a first voltage rail; and
   a bulk of the standard p-channel MOS transistor is coupled to a second voltage rail.

5. The circuit of claim 1, wherein:
   a drain of the first native or depletion n-channel MOS transistor and a source of the second native or depletion n-channel MOS transistor are coupled to the input signal;
   a source of the first native or depletion n-channel MOS transistor is coupled to the standard n-channel MOS transistor; and
   a drain of the second native or depletion n-channel MOS transistor is coupled to the standard p-channel MOS transistor.

6. The circuit of claim 1, wherein:
   a drain of the standard n-channel MOS transistor is coupled to the first native or depletion n-channel MOS transistor;
   a drain of the standard p-channel MOS transistor is coupled to the second native or depletion n-channel MOS transistor; and
   sources of the standard p-channel MOS transistor and the standard n-channel MOS transistor are coupled to the output signal.

7. The circuit of claim 1, wherein:
   the native or depletion n-channel MOS transistors are capable of blocking excessive voltage from the standard MOS transistors; and
   the standard MOS transistors are capable of selectively blocking the input signal from the output signal.

8. An apparatus, comprising:
   a plurality of transfer gates, at least one of the transfer gates comprising:
   a first native or depletion n-channel Metal Oxide Semiconductor (MOS) transistor and a second native or depletion n-channel MOS transistor capable of receiving an input signal; and
   a standard p-channel MOS transistor and a standard n-channel MOS transistor coupled to the native or depletion n-channel MOS transistors and capable of providing an output signal, the output signal based on the input signal.

9. The apparatus of claim 8, wherein gates of the native or depletion n-channel MOS transistors are thicker than gates of the standard MOS transistors.

10. The apparatus of claim 8, wherein:
    gates of the first native or depletion n-channel MOS transistor, the second native or depletion n-channel MOS transistor, and the standard n-channel MOS transistor are capable of receiving a first control signal; and a gate of the standard p-channel MOS transistor is capable of receiving a second control signal.

11. The apparatus of claim 8, wherein:
bulks of the first native or depletion n-channel MOS transistor, the second native or depletion n-channel MOS transistor, and the standard n-channel MOS transistor are coupled to a first voltage rail; and
a bulk of the standard p-channel MOS transistor is coupled to a second voltage rail.

12. The apparatus of claim 8, wherein:
a drain of the first native or depletion n-channel MOS transistor and a source of the second native or depletion n-channel MOS transistor are coupled to the input signal;
a source of the first native or depletion n-channel MOS transistor is coupled to the standard n-channel MOS transistor; and
a drain of the second native or depletion n-channel MOS transistor is coupled to the standard p-channel MOS transistor.

13. The apparatus of claim 8, wherein:
a drain of the standard n-channel MOS transistor is coupled to the first native or depletion n-channel MOS transistor;
a drain of the standard p-channel MOS transistor is coupled to the second native or depletion n-channel MOS transistor; and
sources of the standard p-channel MOS transistor and the standard n-channel MOS transistor are coupled to the output signal.

14. The apparatus of claim 8, wherein:
the native or depletion n-channel MOS transistors are capable of blocking excessive voltage from the standard MOS transistors; and
the standard MOS transistors are capable of selectively blocking the input signal from the output signal.

15. The apparatus of claim 8, wherein at least some of the plurality of transfer gates form a multiplexor; and further comprising one or more signal sources capable of providing a plurality of signals to the multiplexor, the multiplexor capable of outputting a selected one of the signals.

16. The apparatus of claim 15, further comprising:
processing circuitry capable of processing the selected signal output by the multiplexor; and
a controller capable of providing control signals to the multiplexor to control which of the plurality of signals is output to the processing circuitry.

17. The apparatus of claim 16, wherein:
the selected signal comprises an analog signal; and
the processing circuitry comprises an analog-to-digital converter.

18. A method, comprising:
receiving an input signal at a transfer gate; and
providing an output signal that at least approximates the input signal at the transfer gate;
wherein the transfer gate comprises:
a first native or depletion n-channel Metal Oxide Semiconductor (MOS) transistor and a second native or depletion n-channel MOS transistor capable of receiving the input signal; and
a standard p-channel MOS transistor and a standard n-channel MOS transistor coupled to the native or depletion n-channel MOS transistors and capable of providing the output signal.

19. The method of claim 18, further comprising:
blocking excessive voltage from the standard MOS transistors using the native or depletion n-channel MOS transistors; and
selectively blocking the input signal from the output signal using the standard MOS transistors.

20. The method of claim 18, wherein gates of the native or depletion n-channel MOS transistors are thicker than gates of the standard MOS transistors.

* * * * *